United States Patent
Chen et al.

(10) Patent No.: US 9,575,520 B1
(45) Date of Patent: Feb. 21, 2017

(54) MAIN BOARD ASSEMBLY AND SERVER INCLUDING THE SAME

(71) Applicant: MSI COMPUTER (SHENZHEN) CO., LTD., Shenzhen, Guangdong Province (CN)

(72) Inventors: Hsiao-Liang Chen, New Taipei (TW); Tse-Jen Shih, New Taipei (TW)

(73) Assignee: MSI COMPUTER (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 15/076,391

(22) Filed: Mar. 21, 2016

(30) Foreign Application Priority Data

Nov. 20, 2015 (TW) ............................. 104218682 U

(51) Int. Cl.
*G06F 1/16* (2006.01)
*G06F 1/18* (2006.01)
*H05K 7/14* (2006.01)

(52) U.S. Cl.
CPC ............... *G06F 1/185* (2013.01); *G06F 1/186* (2013.01); *H05K 7/1488* (2013.01)

(58) Field of Classification Search
CPC ................................. G06F 1/185; G06F 1/186
USPC .................................................. 361/679.32
See application file for complete search history.

(56) References Cited

U.S. PATENT DOCUMENTS

| | | | | |
|---|---|---|---|---|
| 6,320,752 B1* | 11/2001 | Jang | ......................... | G06F 1/184 361/740 |
| 6,361,343 B1* | 3/2002 | Daskalakis | ............. | G06F 1/184 439/327 |
| 2002/0119682 A1* | 8/2002 | Schmid | .................... | G06F 1/184 439/65 |
| 2008/0259579 A1* | 10/2008 | Chen | ....................... | G06F 1/185 361/756 |
| 2009/0055567 A1* | 2/2009 | Chen | .................... | H05K 7/1429 710/302 |
| 2009/0073645 A1* | 3/2009 | Tsai | ........................ | G06F 1/185 361/679.6 |
| 2013/0301209 A1* | 11/2013 | Zhou | ....................... | G06F 1/186 361/679.32 |
| 2016/0037673 A1* | 2/2016 | Chen | .................... | H05K 7/1489 361/679.02 |

\* cited by examiner

*Primary Examiner* — Nidhi Thaker

(74) *Attorney, Agent, or Firm* — Maschoff Brennan

(57) ABSTRACT

A main board assembly for being equipped with at least one of a standard expansion card and a low profile expansion card includes a base board, a first expansion slot, a second expansion slot, a third expansion slot and a switching circuit. There is a first distance between the second expansion slot and the first edge, and there is a second distance between the second expansion slot and the third expansion slot, which are greater than the width of the standard expansion card. There is a third distance between the first expansion slot and the third expansion slot, which is two times greater than the width of the low profile expansion card.

21 Claims, 9 Drawing Sheets

MAIN BOARD ASSEMBLY AND SERVER INCLUDING THE SAME

CROSS-REFERENCE TO RELATED APPLICATIONS

This non-provisional application claims priority under 35 U.S.C. §119(a) on Patent Application No(s). 104218682 filed in Taiwan, R.O.C. on Nov. 20, 2015, the entire contents of which are hereby incorporated by reference.

TECHNICAL FIELD

The disclosure relates to a main board assembly and a server including the same, more particularly to the main board assembly equipped with multiple riser cards and the server including the same.

BACKGROUND

Server is a computer, which is connected to other computers, receiving requests from the computers and responding to the computers. The requests from the computers, for example, are storage requests, print requests and application operation requests. The server, which is similar to a personal computer, includes a CPU, a memory, an input device and an output device. The CPU, the memory, the input device and the output device are connected by a bus. In detail, a north bridge chip in the bus connects the CPU and the memory, and a south bridge chip connects the input device and the output device. The server is accommodated in a case, and a development of the case has gone through three stages which are a tower type case, a rack mount type case focusing on integration and a blade type case minimizing the use of physical space and energy.

In detail, the rack mount type case is a standardized case which is adapted to a standardized frame. The rack mount type case, as a tower type case optimized in structure, is featured in occupying less space in the frame. The conventional internet servers, such as the network switches, the routers and the firewalls, are located in the rack mount type case and can be pushed in or pulled out from the frame as a drawer. A height of the case is measured in a unit of "U". 1U equals to 1.75 inches or 44.45 millimeters. The conventional cases have the heights from 1U to 7U, wherein the cases having the height of 1U and 2U are most common. In general, the 1U case and the 2U case match main boards with a first specification and a second specification, respectively.

In addition, big data analytics have become important in the IT industry. The big data means the data set is too large or complex to be acquired, processed and analyzed by traditional data processing servers. As a result, the capability of the servers needs to be promoted for timely processing the data sets such as the commercial trend, the research result, the spread of disease, the hotspots of crime and the traffic analysis.

SUMMARY

According to a first embodiment of the disclosure, a server for being equipped with at least one of a standard expansion card and a low profile expansion card is provided. The standard expansion card has a first width, and the low profile expansion card has a second width. The first width is greater than the second width. The server includes a case and a main board assembly. The case includes a supporting plate, a first side plate and a second side plate. The first side plate and the second side plate are respectively connected to two ends of the supporting plate which are opposite to each other. The main board assembly is disposed on the supporting plate. The main board assembly includes a base board, a first expansion slot, a second expansion slot, a third expansion slot and a switching circuit. The first expansion slot is disposed on the base board. The second expansion slot is disposed on the base board, and the first expansion slot is located between the second expansion slot and the first side plate. The third expansion slot is disposed on the base board, and the second expansion slot is located between the first expansion slot and the third expansion slot. The switching circuit is electrically connected to the first expansion slot and the second expansion slot for switching between the first expansion slot and the second expansion slot. There is a first distance between the second expansion slot and the first side plate, and there is a second distance between the first expansion slot and the third expansion slot. The first distance and the second distance are greater than the first width. There is a third distance between the first expansion slot and the third expansion slot, and the third distance is two times greater than the second width.

According to a second embodiment of the disclosure, a server for being equipped with at least one of a standard expansion card and a low profile expansion card is provided. The standard expansion card has a first width, and the low profile expansion card has a second width. The first width is greater than the second width. The server includes a case and a main board assembly. The case includes a supporting plate, a first side plate and a second side plate. The first side plate and the second side plate are respectively connected to two ends of the supporting plate which are opposite to each other. The main board assembly is disposed on the supporting plate. The main board assembly includes a base board, a first expansion slot, a second expansion slot, a third expansion slot and a switching circuit. The first expansion slot is disposed on the base board. The second expansion slot is disposed on the base board, and the first expansion slot is located between the second expansion slot and the first side plate. The third expansion slot is disposed on the base board, and the second expansion slot is located between the first expansion slot and the third expansion slot. The switching circuit is electrically connected to the first expansion slot and the second expansion slot for switching between the first expansion slot and the second expansion slot. There is a first distance between the second expansion slot and the first side plate, and the first distance is greater than the first width.

According to a third embodiment of the disclosure, a main board assembly for being equipped with at least one of a standard expansion card and a low profile expansion card is provided. The standard expansion card has a first width, and the low profile expansion card has a second width. The first width is greater than the second width. The main board assembly includes a base board, a first expansion slot, a second expansion slot, a third expansion slot and a switching circuit. The base board has a first edge and a second edge which are opposite to each other, and the first edge is for being close to a side plate of a case of a server. The first expansion slot is disposed on the base board. The second expansion slot is disposed on the base board, and the first expansion slot is located between the second expansion slot and the first edge. The third expansion slot is disposed on the base board, and the second expansion slot is located between the first expansion slot and the third expansion slot. The switching circuit is electrically connected to the first expansion slot and the second expansion slot for switching between the first expansion slot and the second expansion slot. There is a first distance between the second expansion slot and the first edge, and there is a second distance between the second expansion slot and the third expansion slot. The first distance and the second distance are greater than the first width. There is a third distance between the first expansion slot and the third expansion slot, and the third distance is two times greater than the second width.

BRIEF DESCRIPTION OF THE DRAWINGS

The present disclosure will become better understood from the detailed description given hereinbelow and the accompanying drawings which are given by way of illustration only and thus are not limitative of the present disclosure and wherein.

DETAILED DESCRIPTION

Figure 1:
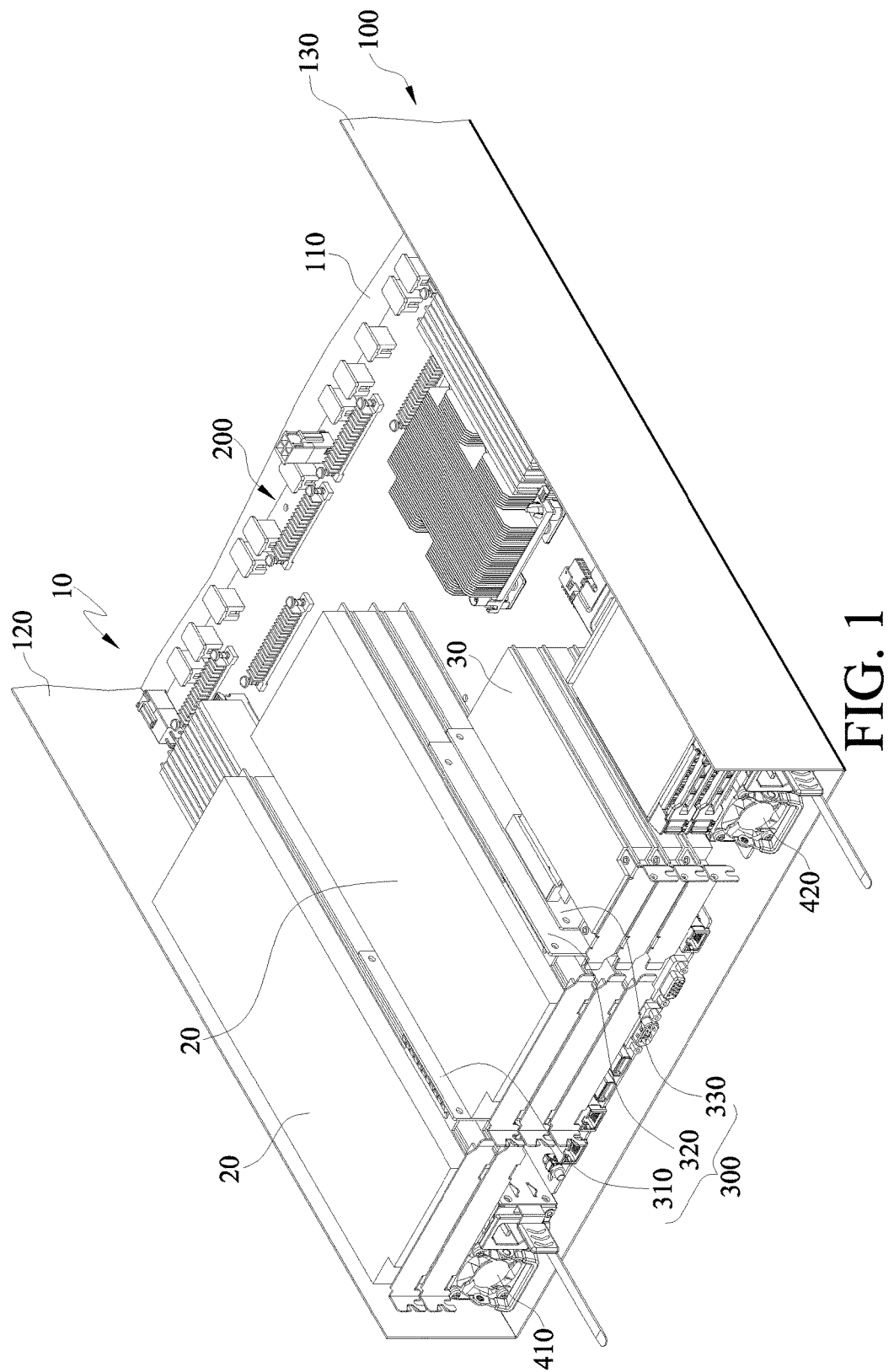
FIG. 1 is a schematic view of a server equipped with standard expansion cards and low profile expansion cards according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
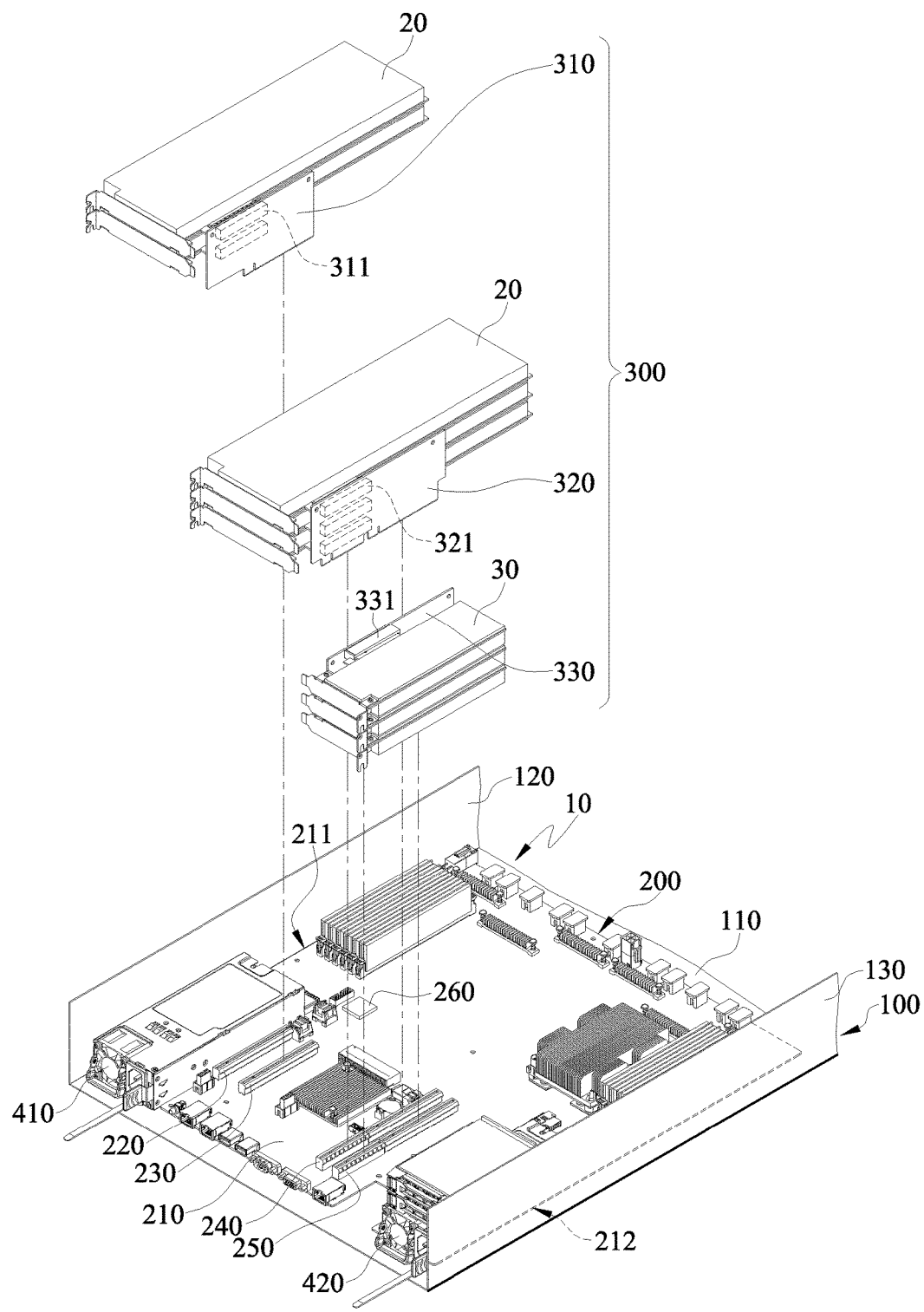
FIG. 2 is an exploded view of the server illustrated in FIG. 1.
Figure 3:
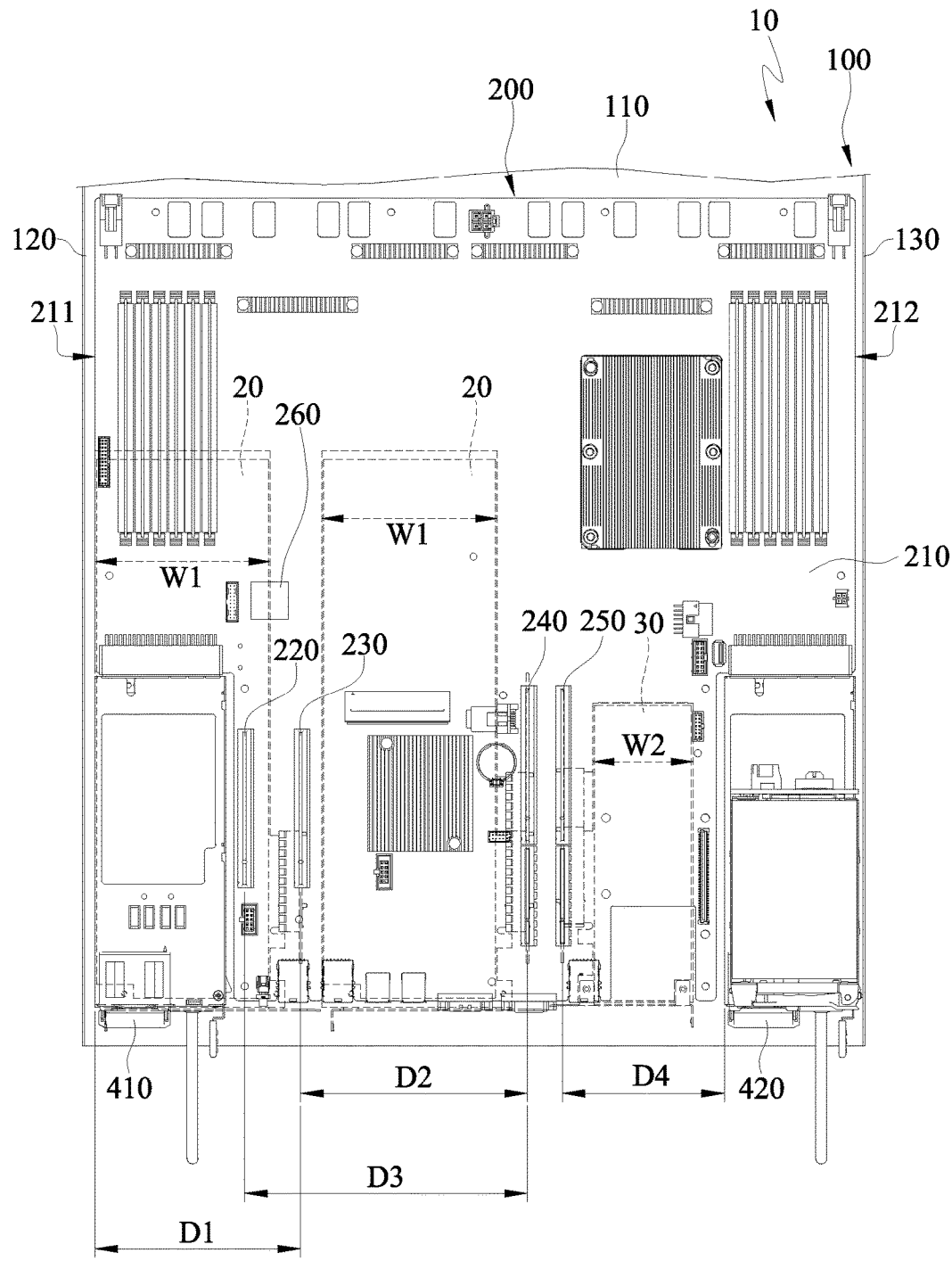
FIG. 3 is a top view of the server illustrated in FIG. 1.

Please refer to FIG. 1 to FIG. 3. FIG. 1 is a schematic view of a server equipped with standard expansion cards and low profile expansion cards according to a first embodiment of the disclosure. FIG. 2 is an exploded view of the server illustrated in FIG. 1. FIG. 3 is a top view of the server illustrated in FIG. 1.

A server 10 in the first embodiment is adopted for being equipped with the standard expansion cards 20 or the low profile expansion cards 30. For example, the standard expansion card 20 has a first width W1. The first width W1, for example is 4.2 inches. The standard expansion cards 20 can be divided into long cards with a length being 12.283 inches and short cards with a length being 6.875 inches. The low profile expansion card 30 has a second width W2, and the first width W1 is greater than the second width W2. The second width W2, for example, is 2.536 inches. The low profile expansion cards 30 can also be divided into long cards with a length being 6.6 inches and short cards with a length being 4.72 inches.

The server 10 includes a case 100, a main board assembly 200 and a riser card assembly 300. The case 100 includes a supporting plate 110, a first side plate 120 and a second side plate 130. The first side plate 120 and the second side plate 130 are respectively connected to two sides of the supporting plate 110 which are opposite to each other. A height of the case 100, for example, is divided into 1U, 2U and 4U. In the first embodiment, the height of the case is 2U, which means the height of the case 100 is 3.5 inches, but the disclosure is not limited thereto.

The main board assembly 200 is disposed on the supporting plate 110. The main board assembly 200 includes a base board 210, a first expansion slot 220, a second expansion slot 230, a third expansion slot 240, a fourth expansion slot 250 and a switching circuit 260.

The base board 210 has a first edge 211 and a second edge 212 which are opposite to each other. The first edge 211 of the base board 210 is close to the first side plate 120 of the case 100, and the second edge 212 of the base board 210 is close to the second side plate 130 of the case 100. The aforementioned term "be close to" means be abutted against or be spaced apart by an extremely short distance.

The first expansion slot 220, the second expansion slot 230, the third expansion slot 240 and the fourth expansion slot 250, for example, is PCI-e ports or PCI ports, and the expansion slots 220, 230, 240, 250 may be all disposed on the base board 210. The first expansion slot 220 is located between the second expansion slot 230 and the first side plate 120, and the second expansion slot 230 is located between the first expansion slot 220 and the third expansion slot 240. The fourth expansion slot 250 is located between the third expansion slot 240 and the second side plate 130.

In the first embodiment, there is a first distance D1 between the second expansion slot 230 and the first side plate 120, and there is a second distance D2 between the second expansion slot 230 and the third expansion slot 240. The first distance D1 and the second distance D2 are all greater than the first width W1 in the first embodiment. In addition, there is a third distance D3 between the first expansion slot 220 and the third expansion slot 240. The third distance D3 is two times greater than the second width W2 in the first embodiment. The above size arrangements of the main board assembly 200 and the switching circuit 260 are favorable for the main board assembly 200 being installed and operated in the case with the height of 1U, the case with the height of 2U or the case with other heights. The detail will be described later.

Not only the arrangement of the distance D1 between the second expansion slot 230 and first side plate 120, the arrangements of the distance D2 between the second expansion slot 230 and the third expansion slot 240 as well as the distance D3 between the first expansion slot 220 and the third expansion slot 240 are also provided in the first embodiment, but the disclosure is not limited thereto. In other embodiments of the disclosure, only the distance between the second expansion slot 230 and the first side plate 120 is arranged, the main board assembly 200 with the switching circuit 260 can also be installed and operated in the case with the height of 1U, the case with the height of 2U or the case with other heights.

In addition, in the first embodiment, the fourth expansion slot 250 is used for further improving the expansion capability of the server 10, but the disclosure is not limited thereto. In other embodiments, there can be no fourth expansion slot 250 in the main board assembly 200

The switching circuit 260 is electrically connected to the first expansion slot 220 and the second expansion slot 230, and the switching circuit is used for switching between the first expansion slot 220 and the second expansion slot 230. In detail, there may be only one of the first expansion slot 220 and the second expansion slot 230 in operation at a time, and the switching circuit 260 determines the first expansion slot 220 or the second expansion slot 230 can be in operation according to a specification of the case 100. For example, when the main board assembly 200 is installed in a case with a height of 1U, the switching circuit 260 determines the first expansion slot 220 in operation so that a function of the riser card inserted in the first expansion slot 220 can be performed. When the main board assembly 200 is installed in a case with a height of 2U, the switching circuit 260 determines the second expansion slot 230 in operation so that a function of the riser card inserted in the second expansion slot 230 can be performed.

The riser card assembly 300 includes a first riser card 310, a second riser card 320 and a third riser card 330. The first riser card 310 is inserted in the second expansion slot 230. A side of the first riser card 310 close to the first side plate 120, for example, has two first electrical connection ports 311. The second riser card 320 is inserted in the third expansion slot 240. A side of the second riser card 320 close to the first side plate 120, for example, has three second electrical connection ports 321. The third riser card 330 is inserted in the fourth expansion slot 250. A side of the third riser card 330 away from the first side plate 120, for example, has three third electrical connection ports 331.

In the first embodiment, the server 10 may further include a first power supply 410 and a second power supply 420. The first power supply 410 may be located between the first expansion slot 220 and the first side plate 120, and the second power supply 420 may be located between the fourth expansion slot 250 and the second side plate 130. There is a fourth distance D4 between the fourth expansion slot 250 and the second power supply 420. The fourth distance D4 is greater than the second width W2 and lesser than the first width W1.

Figure 4:
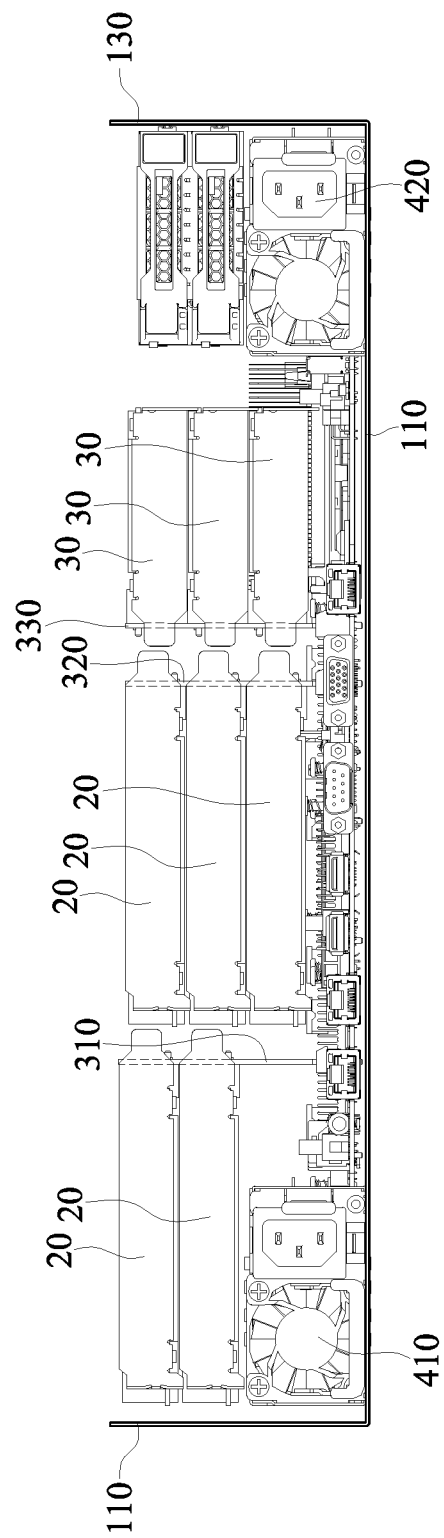
FIG. 4 is a front view of the server illustrated in FIG. 1.

Please refer to FIG. 2 to FIG. 4. FIG. 4 is a front view of the server illustrated in FIG. 1 In the first embodiment, the first distance D1 and the second distance D2 are all greater than the first width W1 (4.2 inches) so that two standard expansion cards 20 can be inserted in the first electrical connection port 311 of the first riser card 310, and three standard expansion cards 20 can be inserted in the second electrical connection ports 321 of the second riser card 320. Moreover, the fourth distance D4 is greater than the second width W2 and lesser than the first width W1 so that three low profile expansion cards 30 can be inserted in the third electrical connection ports 331 of the third riser card 330.

Figure 5:
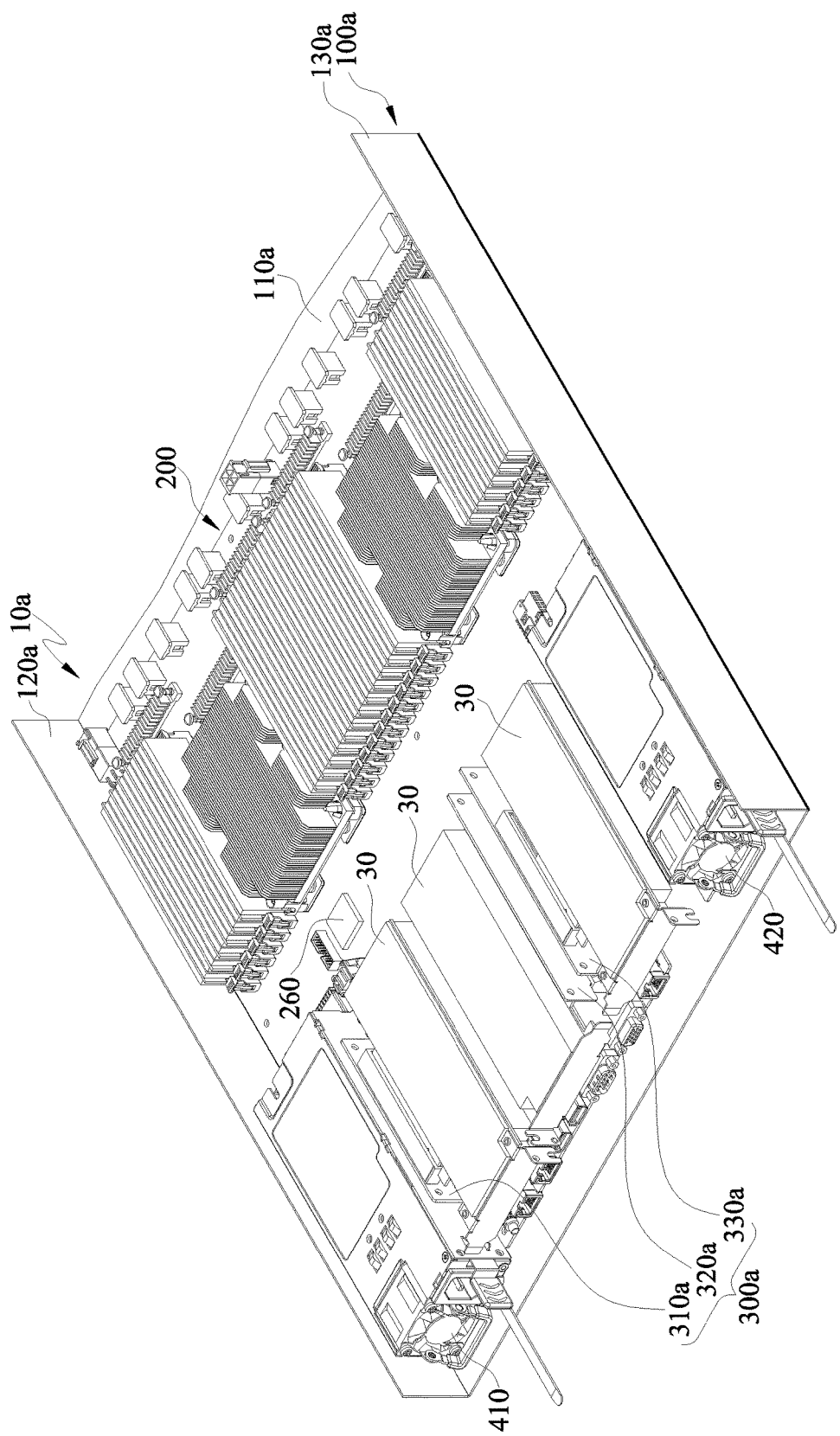
FIG. 5 is a schematic view of a server equipped with low profile expansion cards according to a second embodiment of the disclosure.
Figure 6:
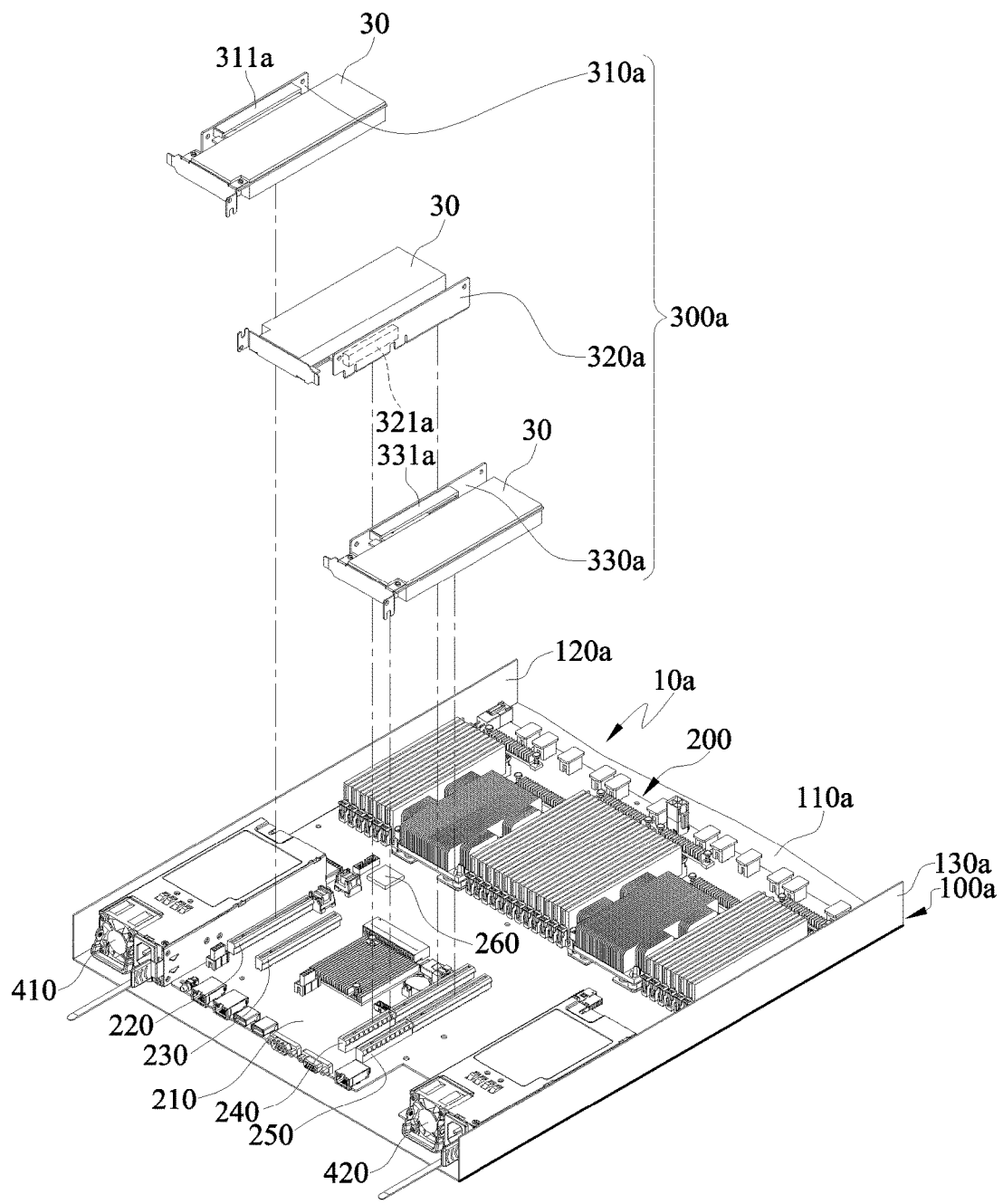
FIG. 6 is an exploded view of the server illustrated in FIG. 5.
Figure 7:
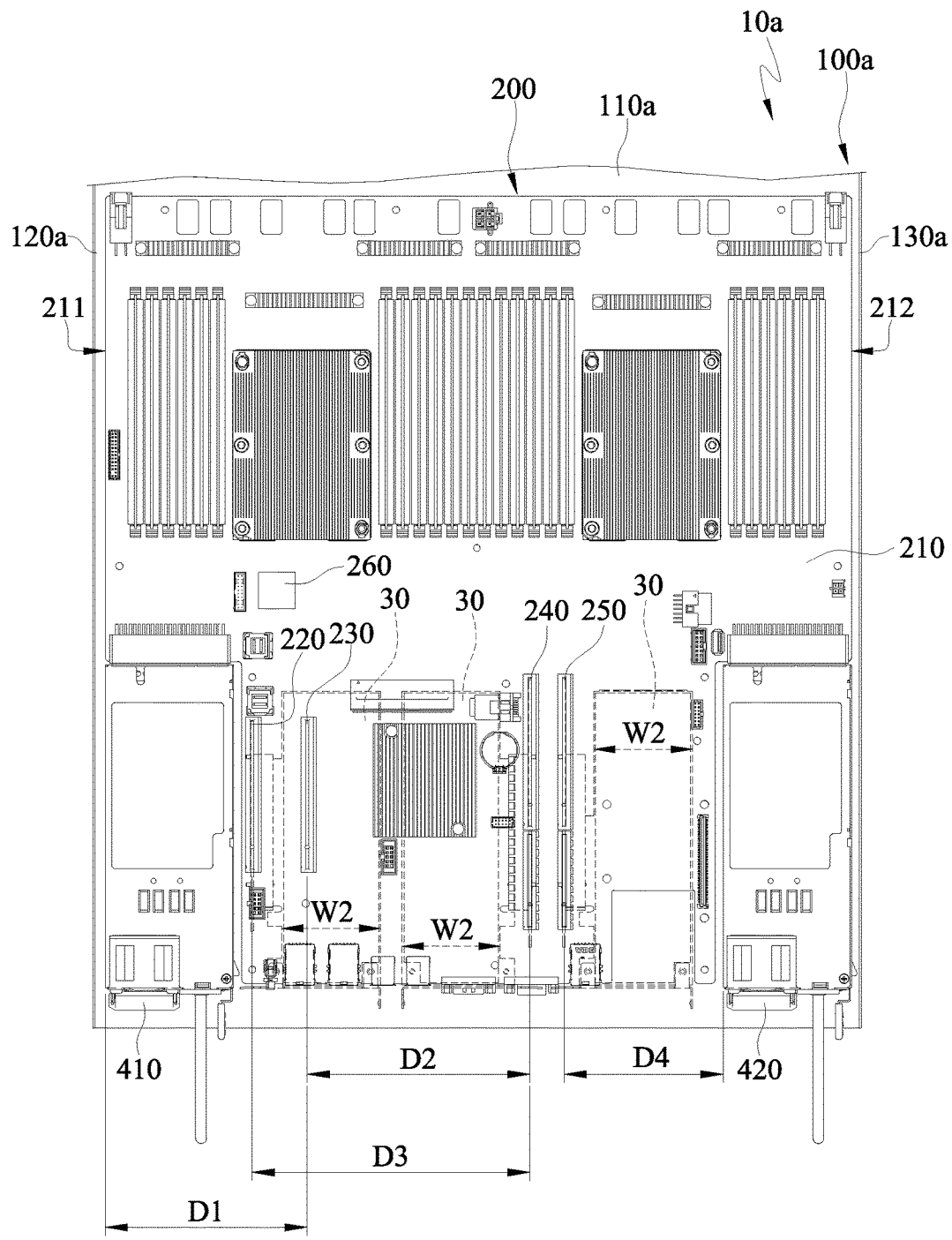
FIG. 7 is a top view of the server illustrated in FIG. 5.

Please refer to FIG. 5 to FIG. 7. FIG. 5 is a schematic view of a server equipped with low profile expansion cards according to a second embodiment of the disclosure. FIG. 6 is an exploded view of the server illustrated in FIG. 5. FIG. 7 is a top view of the server illustrated in FIG. 5.

In the second embodiment, the server 10a includes a case 100a, a main board assembly 200 and a riser card assembly 300a. The structure of the main board assembly 200 in the second embodiment is similar to the structure of the main board assembly 200 in the third embodiment so that the structure of the main board assembly in the second embodiment is not repeated hereafter.

The case 100a includes a supporting plate 110, a first side plate 120 and a second side plate 130. The first side plate 120 and the second side plate 130 are connected to two sides of the supporting plate 110 which are opposite to each other. A height of the case 100, for example, is divided into 1U, 2U and 4U. In the second embodiment, the height of the case 100a is 1U, which means the height of the case is 1.75 inches.

The riser card assembly 300a may include a first riser card 310a, a second riser card 320a and a third riser card 330a. The first riser card 310a is inserted in the first expansion slot 220. A side of the first riser card 310a away from the first side plate 120a, for example, has a first electrical connection port 311a. The second riser card 320a is inserted in the third expansion slot 240. A side of the second riser card 320a close to the first side plate 120, for example, has three second electrical connection ports 321a. The third riser card 330a is inserted in the fourth expansion slot 250. A side of the third riser card 330a away from the first side plate 120, for example, has three third electrical connection ports 331a.

Figure 8:
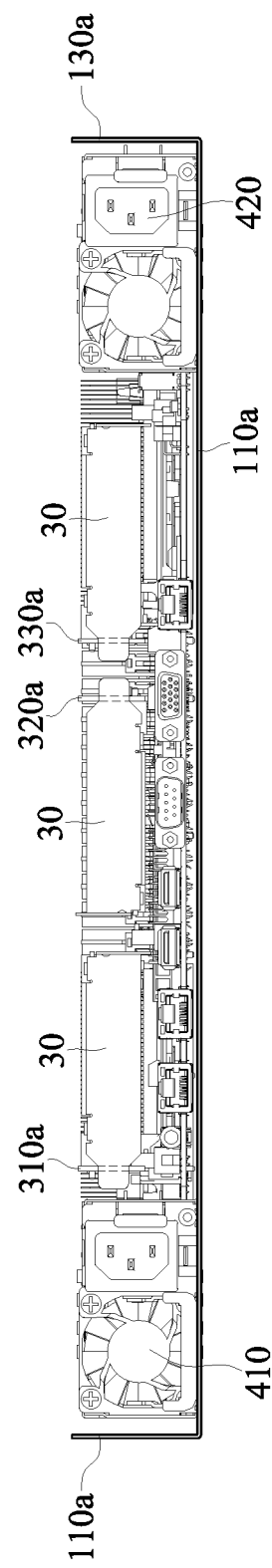
FIG. 8 is a front view of the server illustrated in FIG. 5.

Please refer to FIG. 6 to FIG. 8. FIG. 8 is a front view of the server illustrated in FIG. 5 In the second embodiment, the third distance D3 is two times greater than the second width W2 (2.536 inches) so that one low profile expansion card 30 can be inserted in the first electrical connection port 311a of the first riser card 310a, and another low profile expansion card 30 can also be inserted in the second electrical connection port 321a of the second riser card 320a. Moreover, the fourth distance D4 is greater than the second width W2 and lesser than the first width W1 so that the other low profile expansion card 30 can be inserted in the third electrical connection port 331a of the third riser card 330a.

Figure 9:
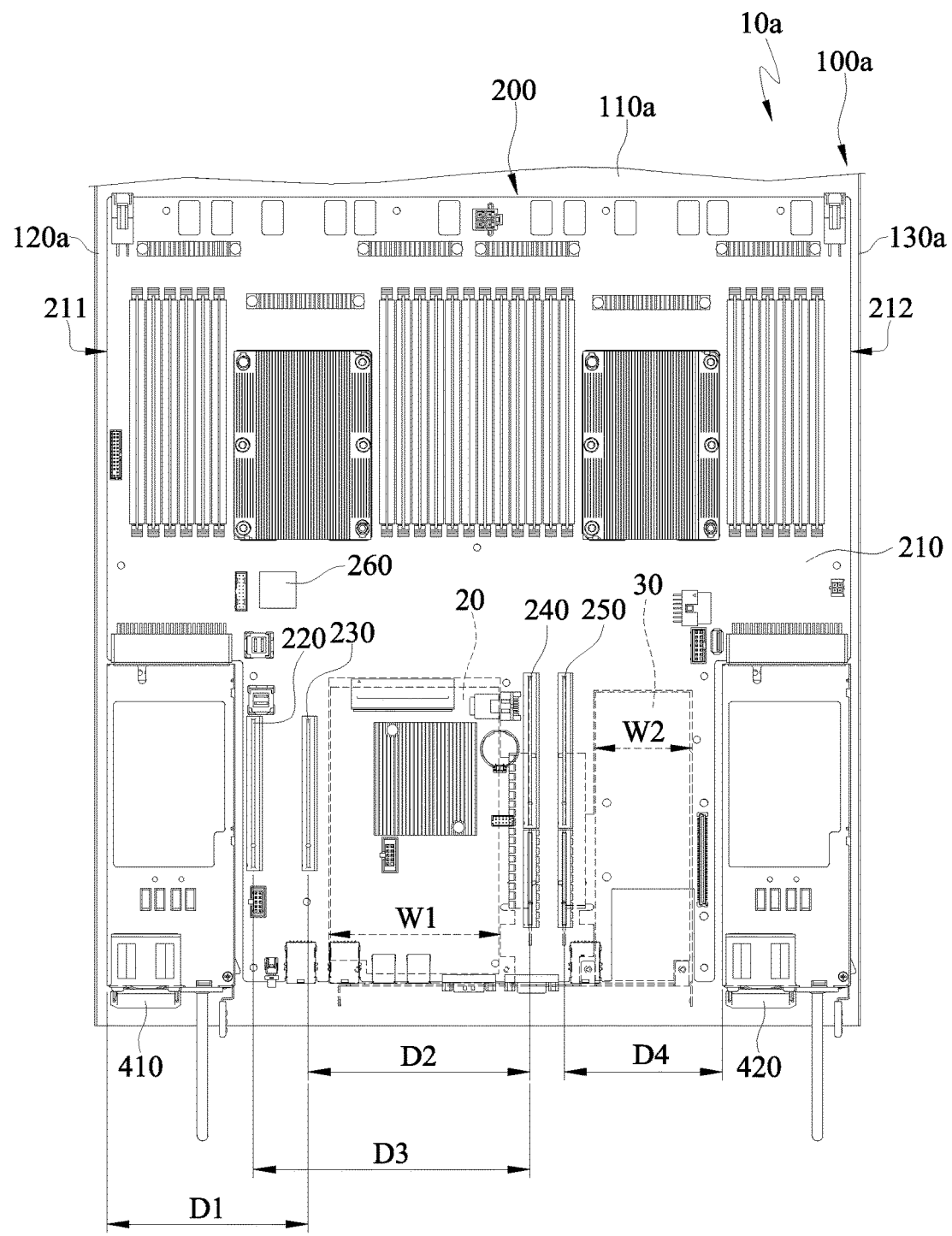
FIG. 9 is a top view of the server illustrated in FIG. 5 equipped with standard expansion cards and low profile expansion cards.

In FIG. 8, two low profile expansion cards 30 are respectively inserted in the first riser card 310a and the second riser card 320a, but the disclosure is not limited thereto. Please refer to FIG. 9. FIG. 9 is a top view of the server illustrated in FIG. 5 equipped with standard expansion cards and low profile expansion cards. As shown in FIG. 9, the second distance D2 is greater than the first width W1 (4.2 inches) so that the low profile expansion card 30 inserted in the connection port 321a of the second riser card 320a can be replaced with one standard expansion card 20. That is, the second riser card 320a can be adapted for the standard expansion card 20 or alternatively the low profile expansion card 30. Moreover, the fourth distance D4 is greater than the second width W2 and lesser than the first width W1 so that the other low profile expansion card 30 can be inserted in the third electrical connection port 331a of the third riser card 330a.

According to the above descriptions of the structure of the server 10 and 10a, when the server 10a is installed in the case 100a with a height of 1U, three low profile expansion cards 30, or alternatively a standard expansion card 20 and a low profile expansion card 30, can be inserted in the server 10a at the same time. When the server 10 is installed in the case with the height of 2U, five standard expansion cards 20 and three low profile expansion cards 30, or alternatively eight low profile expansion cards 30, can be inserted in the server 10 at the same time. However, the disclosure is not limited to the number of the standard expansion card and the low profile expansion card inserted in the server at the same time. Moreover, besides being able to be installed in the case 100a with the height of 1U and the case 100 with the height of 2U, the structure of the main board assembly 200 provides more possible arrangements of the standard expansion card 20 and the low profile expansion card 30 in the server 10.

According to the main board assembly and the server of the disclosure, the first distance between the second expansion slot of the main board assembly and the first side plate is larger than the first width. Therefore, the riser card inserted in the second expansion slot can be insertable for the standard expansion card or the low profile expansion card.

Moreover, the second distance between the second expansion slot of the main board assembly and the third expansion slot is larger than the first width. The third distance between the first expansion slot and the third expansion slot is two times greater than the second width. Therefore, the riser card inserted in the third expansion slot can be insertable for the standard expansion card or the low profile expansion card. When the low profile expansion card is inserted in the raise card located in the third expansion slot, additional amount of space in the server is provided for inserting an additional low profile expansion card in the riser card located in the first expansion slot. As a result, the space utilization in the server is improved.

In addition, the arrangement of the distances between the adjacent expansion slots makes the main board assembly can be installed in the case with the height of 1U and the case with the height of 2U. As a result, the main board for both the 1U case and the 2U case can be developed at once so that the cost of development and manufacturing of the main board is reduced.

What is claimed is:

1. A server for being equipped with at least one of a standard expansion card and a low profile expansion card, the standard expansion card having a first width, the low profile expansion card having a second width, the first width being greater than the second width, and the server comprising:
    a case comprising a supporting plate, a first side plate and a second side plate, the first side plate and the second side plate respectively connected to two ends of the supporting plate which are opposite to each other; and
    a main board assembly disposed on the supporting plate, the main board assembly comprising:
    a base board;
    a first expansion slot disposed on the base board;
    a second expansion slot disposed on the base board, and the first expansion slot located between the second expansion slot and the first side plate;
    a third expansion slot disposed on the base board, and the second expansion slot located between the first expansion slot and the third expansion slot; and
    a switching circuit electrically connected to the first expansion slot and the second expansion slot for switching between the first expansion slot and the second expansion slot;
    wherein, there is a first distance between the second expansion slot and the first side plate, there is a second distance between the first expansion slot and the third expansion slot, the first distance and the second distance are greater than the first width, there is a third distance between the first expansion slot and the third expansion slot, and the third distance is two times greater than the second width.

2. The server of claim 1, further comprising a first riser card and a second riser card, wherein a height of the case is 1U, the first riser card and the second riser card are respectively inserted in the first expansion slot and the third expansion slot, the low profile expansion card is insertable at a side of the first riser card away from the first side plate or alternatively a side of the second riser card close to the first side plate.

3. The server of claim 2, further comprising a third riser card, the main board assembly further comprising a fourth expansion slot, wherein the fourth expansion slot is disposed on the base board and located between the third expansion slot and the second side plate, the third riser card is inserted in the fourth expansion slot, and the low profile expansion card is insertable at a side of the third riser card away from the first side plate.

4. The server of claim 3, further comprising a first power supply located between the first expansion slot and the first side plate.

5. The server of claim 4, further comprising a second power supply located between the third expansion slot and the second side plate.

6. The server of claim 5, wherein there is a fourth distance between the fourth expansion slot and the second power supply, the fourth distance is greater than the second width and less than the first width.

7. The server of claim 1, further comprising a first riser card and a second riser card, wherein a height of the case is 2U, the first riser card and the second riser card are respectively inserted in the first expansion slot and the third expansion slot, the standard expansion card is insertable at a side of the first riser card away from the first side plate or alternatively a side of the second riser card close to the first side plate.

8. The server of claim 7, further comprising a third riser card, the main board assembly further comprising a fourth expansion slot, wherein the fourth expansion slot is disposed on the base board and located between the third expansion slot and the second side plate, the third riser card inserted in the fourth expansion slot, and the low profile expansion card is insertable at a side of the third riser card away from the first side plate.

9. The server of claim 8, further comprising a first power supply located between the first expansion slot and the first side plate.

10. The server of claim 9, further comprising a second power supply located between the third expansion slot and the second side plate.

11. The server of claim 10, wherein there is a fourth distance between the fourth expansion slot and the second power supply, the fourth distance is greater than the second width and less than the first width.

12. The server of claim 1, wherein the first distance and the second distance are both greater than 4.2 inches, and the third distance is greater than 5.072 inches.

13. A server for being equipped with at least one of a standard expansion card and a low profile expansion card, the standard expansion card having a first width, the low profile expansion card having a second width, the first width being greater than the second width, and the server comprising:
    a case comprising a supporting plate, a first side plate and a second side plate, the first side plate and the second side plate respectively connected to two ends of the supporting plate which are opposite to each other; and
    a main board assembly disposed on the supporting plate, the main board assembly comprising:
    a base board;
    a first expansion slot disposed on the base board;
    a second expansion slot disposed on the base board, and the first expansion slot located between the second expansion slot and the first side plate;
    a third expansion slot disposed on the base board, and the second expansion slot located between the first expansion slot and the third expansion slot; and
    a switching circuit electrically connected to the first expansion slot and the second expansion slot for switching between the first expansion slot and the second expansion slot;

wherein, there is a first distance between the second expansion slot and the first side plate, and the first distance is greater than the first width.

14. The server of claim 13, further comprising a first riser card and a second riser card, wherein a height of the case is 1U, the first riser card and the second riser card are respectively inserted in the first expansion slot and the third expansion slot, and the low profile expansion card is insertable at a side of the first riser card away from the first side plate or alternatively a side of the second riser card close to the first side plate.

15. The server of claim 14, further comprising a third riser card, the main board assembly further comprising a fourth expansion slot, wherein the fourth expansion slot is disposed on the base board and located between the third expansion slot and the second side plate, the third riser card is inserted in the fourth expansion slot, and the low profile expansion card is insertable at a side of the third riser card away from the first side plate.

16. The server of claim 13, further comprising a first riser card and a second riser card, wherein a height of the case is 2U, the first riser card and the second riser card are respectively inserted in the first expansion slot and the third expansion slot, the standard expansion card is insertable at a side of the first riser card away from the first side plate or alternatively a side of the second riser card close to the first side plate.

17. The server of claim 16, further comprising a third riser card, the main board assembly further comprising a fourth expansion slot, wherein the fourth expansion slot is disposed on the base board and located between the third expansion slot and the second side plate, the third riser card is inserted in the fourth expansion slot, and the low profile expansion card is insertable at a side of the third riser card away from the first side plate.

18. The server of claim 13, wherein the first distance is greater than 4.2 inches.

19. A main board assembly for being equipped with at least one of a standard expansion card and a low profile expansion card, the standard expansion card having a first width, the low profile expansion card having a second width, the first width being greater than the second width, and the main board assembly comprising:
- a base board having a first edge and a second edge which are opposite to each other, the first edge for being close to a side plate of a case of a server;
- a first expansion slot disposed on the base board;
- a second expansion slot disposed on the base board, and the first expansion slot located between the second expansion slot and the first edge;
- a third expansion slot disposed on the base board, and the second expansion slot located between the first expansion slot and the third expansion slot; and
- a switching circuit electrically connected to the first expansion slot and the second expansion slot for switching between the first expansion slot and the second expansion slot;
- wherein, there is a first distance between the second expansion slot and the first edge, there is a second distance between the second expansion slot and the third expansion slot, the first distance and the second distance are greater than the first width, there is a third distance between the first expansion slot and the third expansion slot, and the third distance is two times greater than the second width.

20. The main board assembly of claim 19, further comprising a fourth expansion slot, the fourth expansion disposed on the base board and located between the third expansion slot and the second edge.

21. The main board assembly of claim 19, wherein the first distance and the second distance are both greater than 4.2 inches, and the third distance is greater than 5.072 inches.

* * * * *